(12) United States Patent
Lee et al.

(10) Patent No.: US 10,141,385 B2
(45) Date of Patent: Nov. 27, 2018

(54) THIN FILM TRANSISTOR SUBSTRATE AND DISPLAY PANEL USING SAME

(71) Applicant: HON HAI PRECISION INDUSTRY CO., LTD., New Taipei (TW)

(72) Inventors: Kuo-Sheng Lee, New Taipei (TW); Sheng-Han Li, New Taipei (TW); Chih-Hao Chang, New Taipei (TW); Po-Fu Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/690,293

(22) Filed: Aug. 30, 2017

(65) Prior Publication Data

US 2018/0061916 A1    Mar. 1, 2018

Related U.S. Application Data

(60) Provisional application No. 62/381,588, filed on Aug. 31, 2016.

(51) Int. Cl.

| H01J 1/62 | (2006.01) |
|---|---|
| H01L 27/32 | (2006.01) |
| G02F 1/1333 | (2006.01) |
| G02F 1/1343 | (2006.01) |
| G06F 3/041 | (2006.01) |
| G06F 3/044 | (2006.01) |

(52) U.S. Cl.
CPC ........ *H01L 27/3248* (2013.01); *G02F 1/1343* (2013.01); *G02F 1/13338* (2013.01); *G02F 1/133345* (2013.01); *G06F 3/044* (2013.01); *G06F 3/0412* (2013.01); *G06F 3/0416* (2013.01); *H01L 27/3262* (2013.01); *H01L 27/3272* (2013.01)

(58) Field of Classification Search
None
See application file for complete search history.

(56) References Cited

U.S. PATENT DOCUMENTS 8,279,361 B2 * 10/2012 Chen .................. G02F 1/13338
                                                                  349/12
9,397,153 B2 *  7/2016 Tanaka ................ H01L 29/0607
9,502,434 B2 * 11/2016 Tanaka ................ H01L 29/7869

FOREIGN PATENT DOCUMENTS

CN        105468202        4/2016
TW        201120548        6/2011

* cited by examiner

*Primary Examiner* — Vip Patel
(74) *Attorney, Agent, or Firm* — ScienBiziP, P.C.

(57) ABSTRACT

A TFT substrate for a display panel includes a substrate, a plurality of first scanning lines and a plurality of data lines thereon. A conductive layer is applied above the first scanning lines and at least one electrically insulating layer between the plurality of first scanning lines and the conductive layer. A touch sensing layer is placed above the conductive layer. The conductive layer forms a plurality of second scanning lines and a plurality of touch traces. Each touch trace is electrically coupled to the touch sensing layer. Each second scanning line is electrically coupled to one first scanning line by extending through the at least one electrically insulating layer.

20 Claims, 11 Drawing Sheets

THIN FILM TRANSISTOR SUBSTRATE AND DISPLAY PANEL USING SAME

FIELD

The subject matter herein generally relates to a thin film transistor (TFT) substrate and a display panel using the TFT substrate.

BACKGROUND

Nowdays, narrow border has become a trend in the development of the display panel. A gate driver is generally positioned in a left border region or a right border region of the display panel, thus limiting the possibilities for narrowing the left border region or the right border region. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
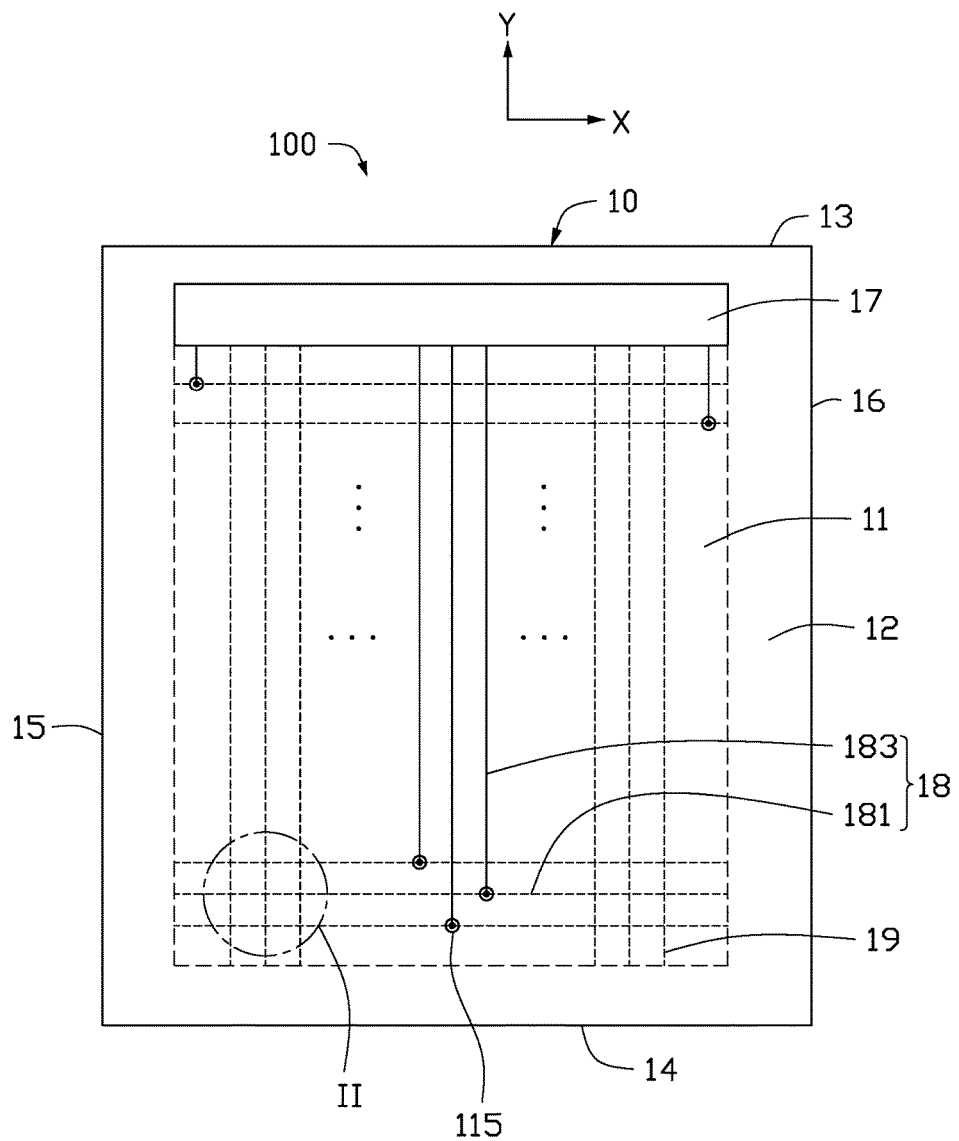
FIG. 1 is a planar view of a first exemplary embodiment of a display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

FIG. 1 through FIG. 4 illustrate a display panel 100 according to a first exemplary embodiment. As shown in FIG. 1, the display panel 100 includes a TFT substrate 10. The TFT substrate 10 defines a display area 11 and a non-display area 12 surrounding the display area 11. The TFT substrate 10 has four sides, which are an upper side 13, a lower side 14, a left side 15, and a right side 16. When the display panel 100 is being used, the upper side 13 and the lower side 14 are generally horizontal and the left side 15 and the right side 16 are generally vertical.

For the TFT substrate 10, a portion of the non-display area 12 between the display area 11 and the upper side 13 is defined as an upper border region; a portion of the non-display area 12 between the display area 11 and the lower side 14 is defined as a lower border region; a portion of the non-display area 12 between the display area 11 and the left side 15 is defined as a left border region, and a portion of the non-display area 12 between the display area 11 and the right side 16 is defined as a right border region.

The display panel 100 further includes a gate driver 17 in the upper border region or the lower border region. In the present exemplary embodiment, the gate driver 17 is in the upper border region. The gate driver 17 does not occupy either the left border region or the right border region, thereby facilitating the narrowing of the left and right borders of the display panel 100.

Figure 2:
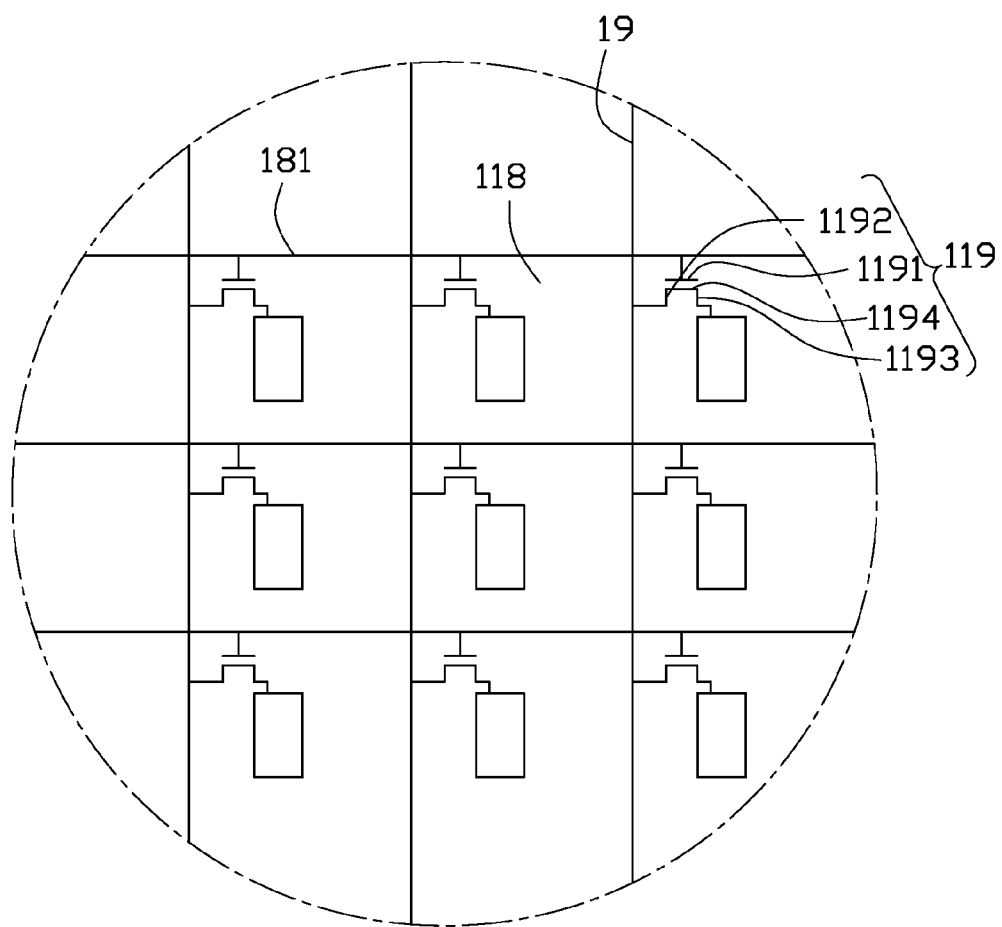
FIG. 2 is an enlarged view of circled portion II of FIG. 1.

As shown in FIG. 1, the TFT substrate 10 includes a plurality of scanning lines 18 and a plurality of data lines 19 in the display area 11. Each of the scanning lines 18 includes a first scanning line 181 and a second scanning line 183 coupled to the first scanning line 181. As shown in FIG. 2, the first scanning lines 181 intersect the data lines 19, and a plurality of pixel units 118 is defined by the first scanning lines 181 and the data lines 19. As shown in FIG. 2, at least one TFT 119 is positioned in each pixel unit 118. Each TFT 119 includes a gate electrode 1191, a source electrode 1192, a drain electrode 1193, and a channel layer 1194. As shown in FIG. 1, each scanning line 18, especially the second scanning line 183 of each scanning line 18, is electrically coupled to the gate driver 17. As shown in FIG. 2, the first scanning line 181 of each scanning line 18 is electrically coupled to the gate electrodes 1191. That is, the gate driver 17 is electrically coupled to the gate electrodes 1191 by the scanning lines 18 and driving signals from the gate driver 17 can be thereby transmitted to the gate electrodes 1191 of the TFTs 119.

Figure 3:
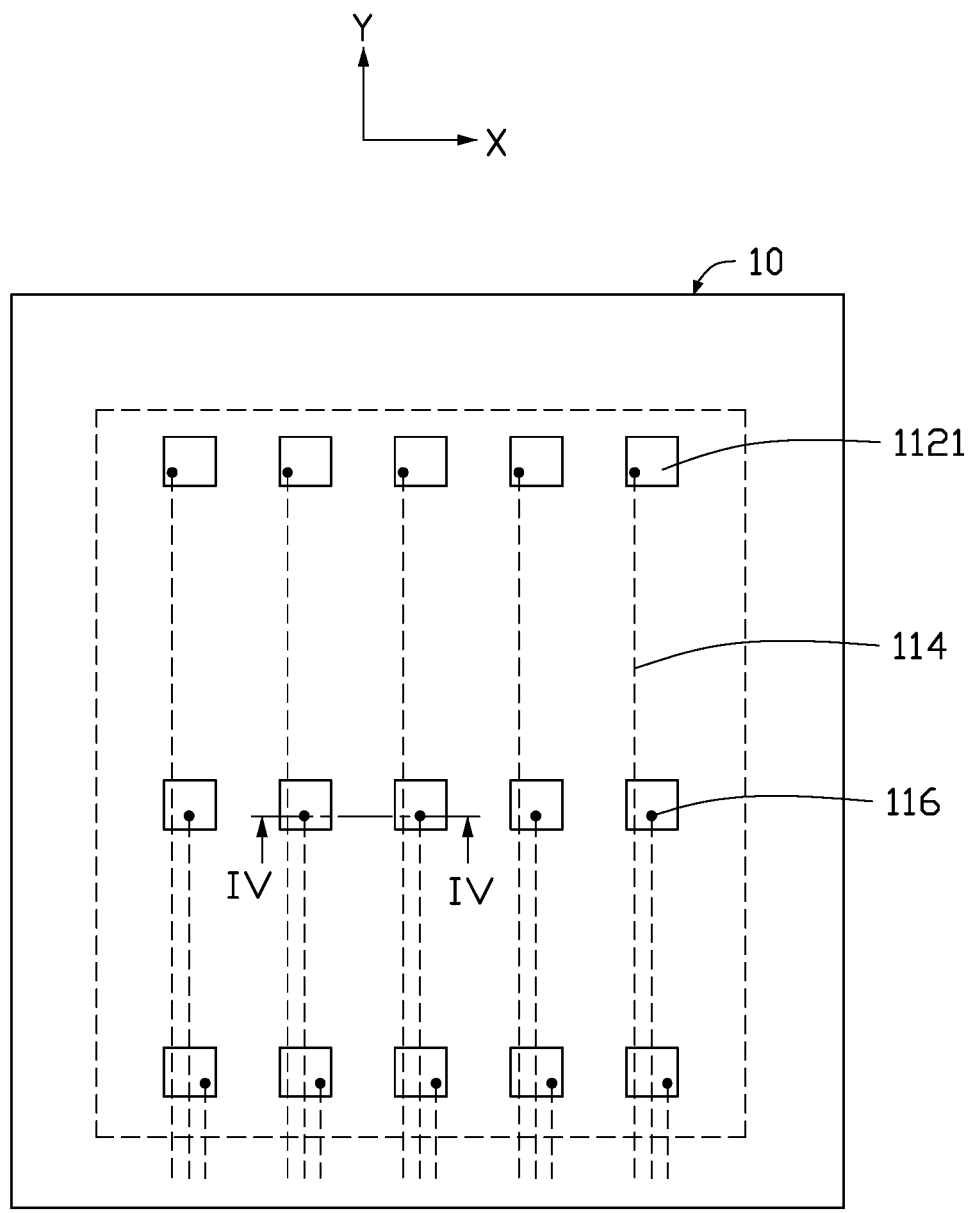
FIG. 3 is a planar view of a TFT substrate of the display panel of FIG. 1.

As shown in FIG. 3, the TFT substrate 10 further includes a plurality of touch sensing electrodes 1121 in the display area 11. The touch sensing electrodes 1121 are spaced apart from each other. Each touch sensing electrode 1121 is electrically coupled to a driver IC (not shown) by a touch trace 114. The driver IC is configured to supply driving signals for the touch sensing electrodes 1121 and receive sensing signals from the touch sensing electrodes 1121.

Figure 4:
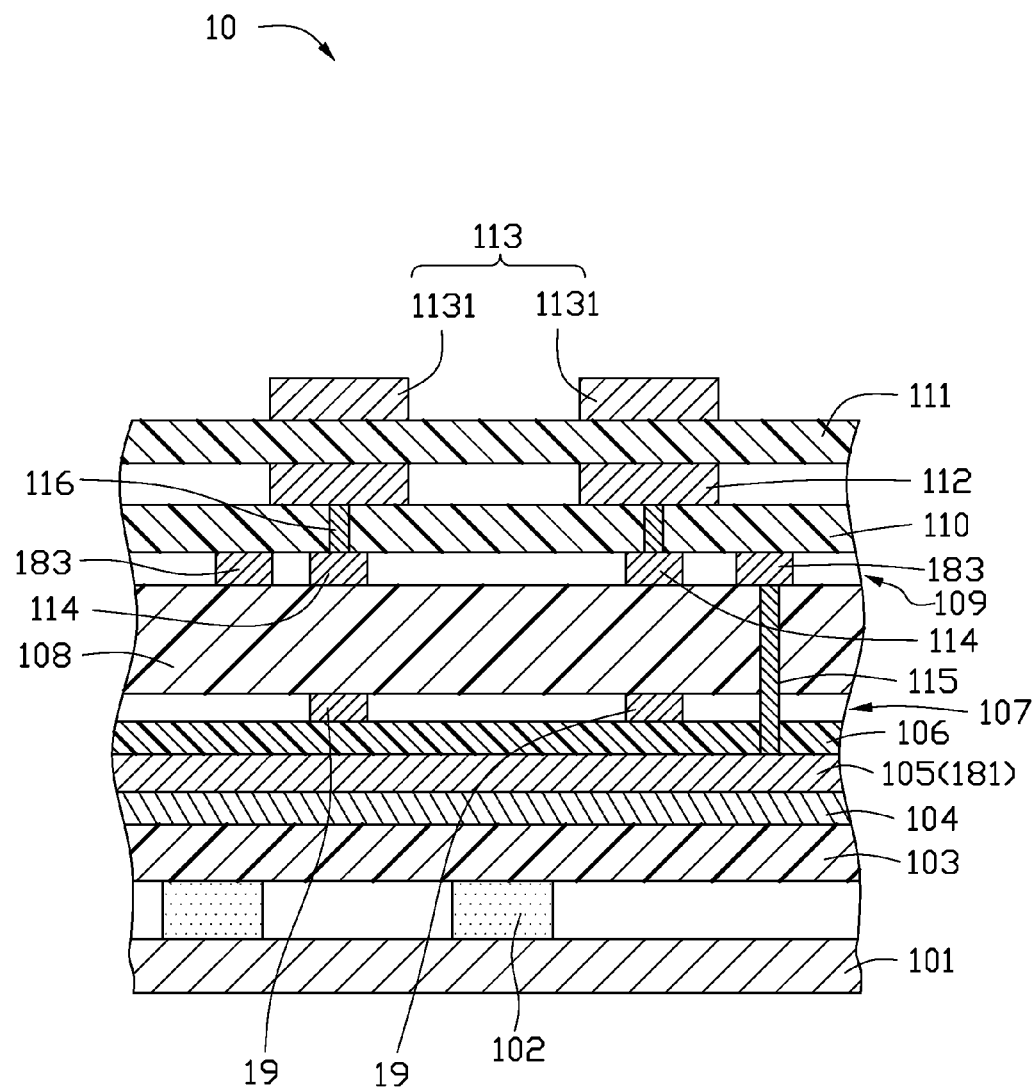
FIG. 4 is a cross-sectional view of the TFT substrate of FIG. 3 along the line IV-IV.

FIG. 4 is a cross-sectional view of the TFT substrate of FIG. 3 taken along line IV-IV. As shown in FIG. 4, the TFT substrate 10 includes a substrate 101, a light shielding layer 102 stacked on the substrate 101, and a buffer layer 103 is stacked on the light shielding layer 102. A first insulating layer 104 is stacked on the buffer layer 103, a first conductive layer 105 is stacked on the first insulating layer 104, and a second insulating layer 106 is stacked on the first conductive layer 105. A second conductive layer 107 is stacked on the second insulating layer 106, a planar layer 108 is stacked on the second conductive layer 107, and a third conductive layer 109 is stacked on the planar layer 108. A first passivation layer 110 is stacked on the third conductive layer 109, and a touch sensing layer 112 is stacked on the first passivation layer 110. FIG. 4 also shows that the TFT substrate 10 includes a second passivation layer 111 and a pixel electrode layer 113 that are not shown in FIG. 3. The second passivation layer 111 is stacked on the touch sensing layer 112, and the pixel electrode layer 113 is stacked on the second passivation layer 111. It is understood that light shielding layer 102 and the buffer layer 103 may be omitted.

The first conductive layer 105 may form the gate electrodes 1191 (not shown in FIG. 4) of the TFTs and the first scanning line 181 electrically coupled to the gate electrodes 1191. The second conductive layer 107 may form the source electrodes 1192 (not shown in FIG. 4) of the TFTs, the drain electrodes 1193 (not shown in FIG. 4) of the TFTs, and the data lines 19 electrically coupled to the source electrodes 1192. The third conductive layer 109 may form the second scanning lines 183 and the touch traces 114.

The channel layer 1194 of the TFTs is not shown in FIG. 4, it may be formed on the second insulating layer 106. The light shielding layer 102 overlaps with the channel layer 1194, thus light from a backlight module (not shown) of the display panel 100 cannot be irradiated to the channel layer 1194. This avoids electrical leakage from the channel layer 1194, which would affect the performance of the TFT 119.

As shown in FIG. 4, the second scanning lines 183 are stacked on the first scanning lines 181, and an insulating material layer is provided between the first scanning lines 181 and the second scanning lines 183. In the present exemplary embodiment, the insulating material layer includes the second insulating layer 106 and the planar layer 108 stacked on the second insulating layer 106.

One end of each first scanning line 181 is electrically coupled to one second scanning line 183, as shown in FIG. 1, and each first scanning line 181 is also electrically coupled to the gate electrodes 1191 of the TFTs 119 as shown in FIG. 2. One end of each second scanning line 183 is electrically coupled to one first scanning line 181, and the other end of each second scanning line 183 is electrically coupled to the gate driver 17. As shown in FIG. 1, the first scanning lines 181 and the second scanning lines 183 are in the display area 11 and each of the first scanning lines 181 is electrically coupled to one second scanning line 183 in the display area 11. The gate electrodes 1191 of the TFTs 119 are electrically coupled to the gate driver 17 by the first scanning line 181 and the second scanning line 183. The gate driver 17 does not occupy the left border region or the right border region of the TFT substrate 10, thereby facilitating the narrowing of the left and right borders of the display panel 100.

Specifically, in the present exemplary embodiment, as shown in FIG. 4, one first scanning line 181 and its corresponding second scanning line 183 are electrically connected to each other in the display area 11 by a first via hole 115. The first via hole 115 extends through both the second insulating layer 106 and the planar layer 108.

As shown in FIG. 1, each first scanning line 181 extends along a first direction (the X axis direction of FIG. 1), and each second scanning line 183 and each data line 19 extend along a second direction (the Y axis direction of FIG. 1). The second direction is different from the first direction. In the present exemplary embodiment, the first direction is perpendicular to the second direction. In order to avoid the first via hole 115 from extending through the data line 19, a projection of each second scanning line 183 on the substrate 101 does not overlap with a projection of any data line 19 on the substrate 101.

As shown in FIG. 4, the touch sensing layer 112 forms the plurality of touch sensing electrodes 1121 which are spaced apart from each other. Each touch sensing electrode 1121 is electrically coupled to one touch trace 114 by a second via hole 116. The second via hole 116 extends through the first passivation layer 110. The pixel electrode layer 113 forms a plurality of pixel electrodes 1131. The touch sensing layer 112 and the pixel electrode layer 113 may be made of a transparent conductive material, such as indium tin oxide (ITO).

As shown in FIG. 4, the touch traces 114 and the second scanning lines 183 are located in a same layer (e. g. third conductive layer 109), and each touch trace 114 and each second scan line 183 may extend along the second direction (the Y axis direction of FIG. 3). Each touch trace 114 is electrically insulated from the second scanning lines 183. In order to reduce the effect of the third conductive layer 109 on the display, each touch trace 114 overlaps with one data line 19. That is, a projection of each touch trace 114 on the substrate 101 overlaps with a projection of one data line 19 on the substrate 101.

In the present exemplary embodiment, the touch sensing electrodes 1121 are arranged in a matrix. The display panel 100 may perform a self-capacitive touch sensing. In other embodiments, the touch sensing electrodes 1121 may be arranged otherwise. In the present exemplary embodiment, the plurality of touch sensing electrodes 1121 also functions as the common electrodes of the display panel 100. When the touch sensing electrodes function as the common electrode, the touch sensing electrodes 1121 cooperate with the pixel electrodes 1131 to rotate liquid crystal molecules (not shown). Specifically, the touch sensing electrodes 1121 and the pixel electrodes 1131 cooperatively generate electric fields to rotate the liquid crystal molecules (not shown) of the liquid crystal layer (not shown).

The substrate 101 is made of a transparent glass, a transparent quartz, or a transparent plastic. In other embodiments, the substrate 101 may be made of ceramic material or silicon. In other embodiments, the substrate 101 may be made of a flexible material, such as polyether sulphone (PES), polyethylene naphthalate (PEN), polyethylene (PE), polyimide (PI), polyvinylchloride (PVC), or polyethylene terephthalate (PET). The light shielding layer 102 may be made of a metal or an alloy, but is not limited thereto, and prevents light from interfering with the TFT. The first conductive layer 105, the second conductive layer 107, and the third conductive layer 109 are made of a metal or an alloy, such as aluminum (Al), silver (Ag), gold (Au), cobalt (Co), nickel (Ni), neodymium (Nd), palladium (Pd), platinum (Pt), titanium (Ti), tungsten (W), or zinc (Zn). The buffer layer 103, the first insulating layer 104, the second insulating layer 106, the planar layer 108, the first passivation layer 110, and the second passivation layer 111 are all made of an electrically insulating material selected from the group consisting of silicon oxide ($SiO_x$), silicon nitride ($SiN_x$), oxynitride ($SiO_xN_y$), alumina ($AlO_x$), yttrium oxide ($Y_2O_3$), hafnium oxide ($HfO_x$), zirconium oxide ($ZrO_x$), aluminum nitride (AlN), and aluminum oxynitride (AlNO).

Figure 5:
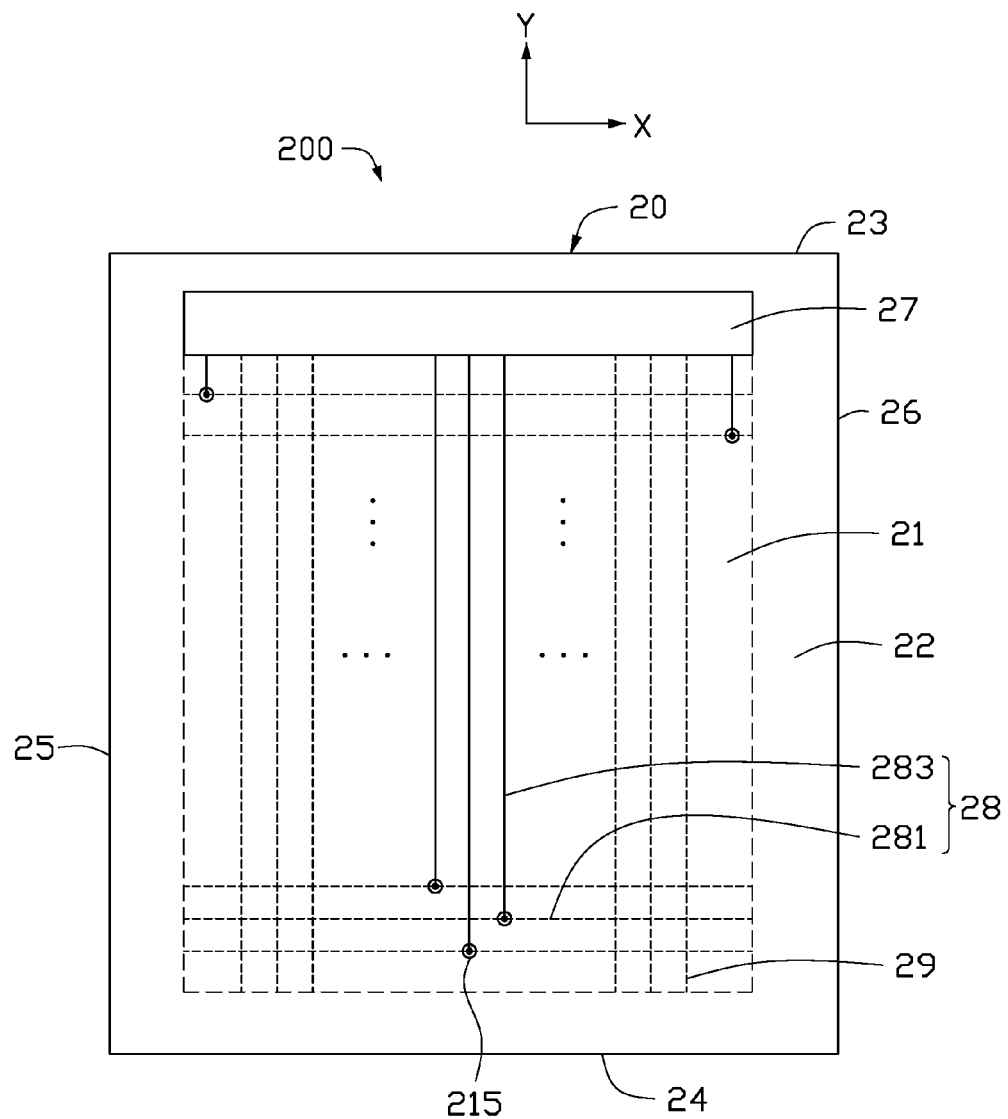
FIG. 5 is a planar view of a second exemplary embodiment of a display panel.
Figure 6:
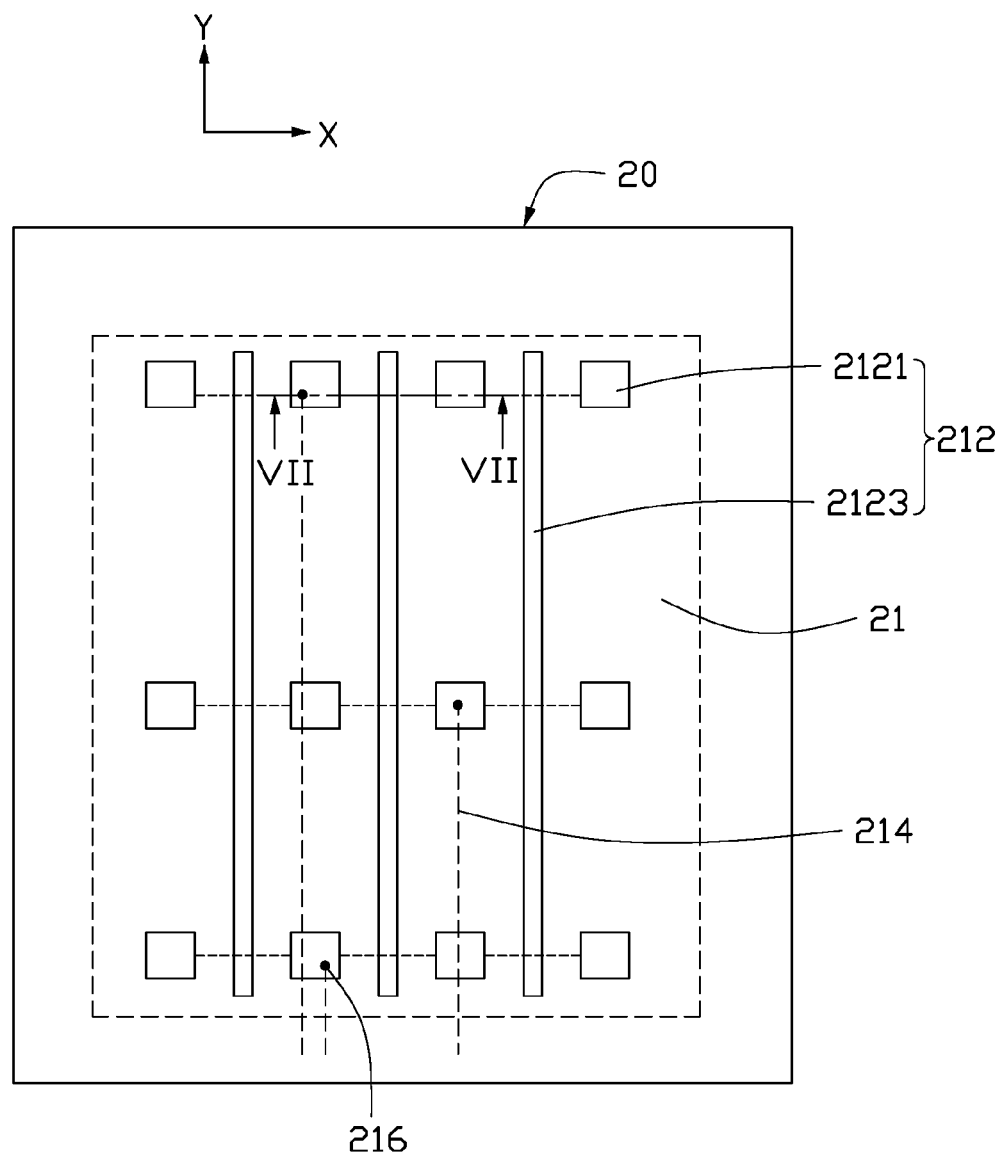
FIG. 6 is a planar view of a TFT substrate of the display panel of FIG. 5.
Figure 7:
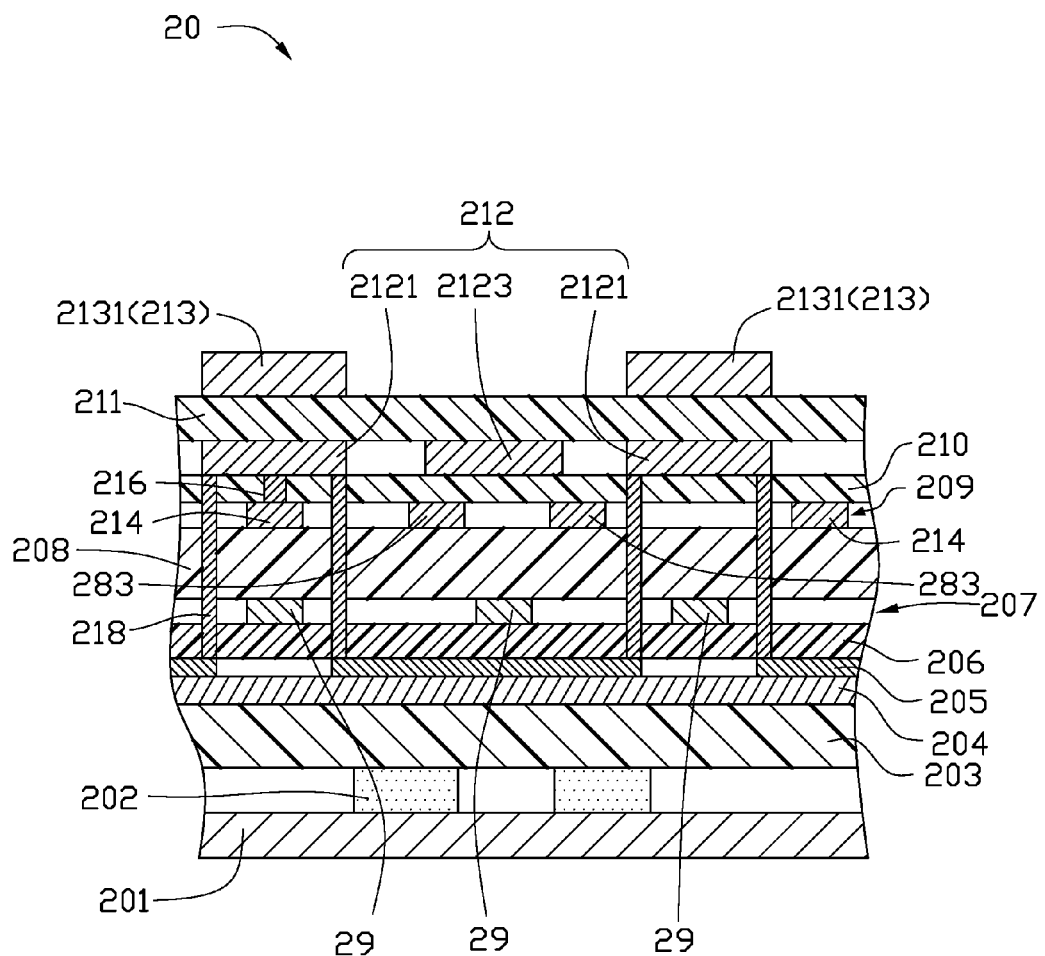
FIG. 7 is a cross-sectional view of the TFT substrate of FIG. 6 along the line VII-VII.

FIG. 5 through FIG. 7 illustrate a display panel 200 according to a second exemplary embodiment. As shown in FIG. 5, the display panel 200 includes a TFT substrate 20. The TFT substrate 20 defines a display area 21 and a non-display area 22 surrounding the display area 21. The TFT substrate 20 has four sides, an upper side 23, a lower side 24, a left side 25, and a right side 26. When the display panel 200 is being used, the upper side 23 and the lower side 24 are generally horizontal, and the left side 25 and the right side 26 are generally vertical.

For the TFT substrate 20, a portion of the non-display area 22 between the display area 21 and the upper side 23 is defined as an upper border region. A portion of the non-display area 22 between the display area 21 and the lower side 24 is defined as a lower border region. A portion of the non-display area 22 between the display area 21 and the left side 25 is defined as a left border region, and a portion of the non-display area 22 between the display area 21 and the right side 26 is defined as a right border region.

The display panel 200 further includes a gate driver 27 in the upper border region or in the lower border region. In the present exemplary embodiment, the gate driver 27 is in the upper border region. The gate driver 27 does not occupy the left border region or the right border region of the TFT substrate 20, thereby facilitating the narrowing of the left and right borders of the display panel 200.

As shown in FIG. 5, the TFT substrate 20 includes a plurality of scanning lines 28 and a plurality of data lines 29 in the display area 21. Each of the scanning lines 28 includes a first scanning line 281 and a second scanning line 283 coupled to the first scanning line 281. The first scanning lines 281 intersect the data lines 29. Each scanning line 28, especially the second scanning line 283 of each scanning line 28, is electrically coupled to the gate driver 27; and the first scanning line 281 of each scanning line 28 is electrically coupled to the gate electrodes of TFTs (not shown). That is, the gate driver 27 is electrically coupled to the gate electrodes (not shown) by the scanning line 28 and driving signals from the gate driver 27 can thereby be transmitted to the gate electrodes of the TFTs.

As shown in FIG. 6, the TFT substrate 20 includes a touch sensing layer 212. The touch sensing layer 212 includes a plurality of first touch sensing electrodes 2121 and a plurality of second touch sensing electrodes 2123 in the display area 21. The first touch sensing electrodes 2121 are spaced apart from each other and arranged in an array. The first touch sensing electrodes 2121 are arranged in rows, and each row of the first touch sensing electrodes 2121 extends along a first direction (the X axis direction in FIG. 6), and rows of the first touch sensing electrodes 2121 are arranged spaced apart from each other and along a second direction (the Y axis direction in FIG. 6). Each second touch sensing electrode 2123 extends as a strip along the second direction and crosses with all the rows of the first touch sensing electrodes 2121. Each second touch sensing electrode 2123 is positioned between two adjacent first touch sensing electrodes 2121.

The first touch sensing electrodes 2121 in each row are electrically coupled together. One first touch sensing electrode 2121 in each row is electrically coupled to a driver IC (not shown) by a touch trace 214. Each row of the first touch sensing electrodes 2121 may function as a signal transmitting electrode, and each second touch sensing electrode 2123 can function as a signal receiving electrode.

FIG. 7 is a cross-sectional view of the TFT substrate of FIG. 6 taken along line VII-VII. As shown in FIG. 7, the TFT substrate 20 includes a substrate 201, a light shielding layer 202 stacked on the substrate 201, and a buffer layer 203 stacked on the light shielding layer 202. A first insulating layer 204 is stacked on the buffer layer 203, a first conductive layer 205 is stacked on the first insulating layer 204, and a second insulating layer 206 is stacked on the first conductive layer 205 A second conductive layer 207 is stacked on the second insulating layer 206, a planar layer 208 is stacked on the second conductive layer 207, and a third conductive layer 209 is stacked on the planar layer 208. A first passivation layer 210 is stacked on the third conductive layer 209 and a touch sensing layer 212 is stacked on the first passivation layer 210. FIG. 7 also shows that the TFT substrate 20 includes a second passivation layer 211 and a pixel electrode layer 213, neither are shown in FIG. 6. The second passivation layer 211 is stacked on the touch sensing layer 212, and the pixel electrode layer 213 is stacked on the second passivation layer 211. It is understood that light shielding layer 202 and the buffer layer 203 may be omitted.

The first conductive layer 205 may form the gate electrodes (not shown) of the TFTs and the first scanning line 281 electrically coupled to the gate electrodes. The second conductive layer 207 may form the source electrodes (not shown) of the TFTs, the drain electrodes (not shown) of the TFTs, and the data lines 29 which are electrically coupled to the source electrodes. The third conductive layer 209 may form the second scanning lines 283 and the touch traces 214.

The channel layers of TFTs are not shown in FIG. 7. The channel layers may be formed on the second insulating layer 206. The light shielding layer 202 overlaps with the channel layer, thus light from a backlight module (not shown) of the display panel 200 cannot be irradiated to the channel layer.

As shown in FIG. 7, the second scanning lines 283 are stacked on the first scanning lines 281, and an insulating material layer is provided between the first scanning lines 281 and the second scanning lines 283. In the present exemplary embodiment, the insulating material layer includes the second insulating layer 206 and the planar layer 208 stacked on the second insulating layer 206.

One end of each first scanning line 281 is electrically coupled to one second scanning line 283 as shown in FIG. 5. Each first scanning line 281 is also electrically coupled to the gate electrodes (not shown), and one end of each second scanning line 283 is electrically coupled to one first scanning line 281. The other end of each second scanning line 283 is electrically coupled to the gate driver 27. As shown in FIG. 5, both the first scanning lines 281 and the second scanning lines 283 are in the display area 21 and each first scanning line 281 is electrically coupled to one second scanning line 283 in the display area 21. The gate driver 27 does not occupy either the left border region or the right border region of the TFT substrate 20, thereby facilitating the narrowing of the left and right borders of the display panel 200.

Specifically, in the present exemplary embodiment, and as shown in FIG. 5, one first scanning line 281 and its corresponding second scanning line 283 are electrically connected to each other in the display area 21 by a first via hole 215. The first via hole 215 extends through both the second insulating layer 206 (shown in FIG. 7) and the planar layer 208 (shown in FIG. 7).

As shown in FIG. 5, each first scanning line 281 extends along a first direction (the X axis direction of FIG. 5), and each second scanning line 283 and each data line 29 extend along a second direction (the Y axis direction of FIG. 5) that is different from the first direction. In the present exemplary embodiment, the first direction is perpendicular to the second direction. In order to avoid the first via hole 215 from extending through the data line 29, a projection of each second scanning line 283 on the substrate 201 does not overlap with a projection of any data line 29 on the substrate 201.

As shown in FIG. 7, the touch sensing layer 212 forms a plurality of first touch sensing electrodes 2121 and a plurality of second touch sensing electrodes 2123. Each first touch sensing electrode 2121 is electrically coupled to at least one conductive line 218, and each conductive line 218 extends through the first passivation layer 210, the planar layer 208, and the second insulating layer 206. Two conductive lines 218 of every two adjacent first touch sensing electrodes 2121 are electrically coupled together above the first insulating layer 204, thus the first touch sensing electrodes 2121 in each row are electrically coupled together. One first touch sensing electrode 2121 in each row is electrically coupled to one touch trace 214 by a second via hole 216. The second via hole 216 extends through the first passivation layer 210. The pixel electrode layer 213 forms a plurality of pixel electrodes 2131. The touch sensing layer 212 and the pixel electrode layer 213 may be made of a transparent conductive material, such as indium tin oxide (ITO).

As shown in FIG. 7, the touch traces 214 and the second scanning lines 283 are located in a same layer (i.e third conductive layer 209), and each touch trace 214 and each second scan line 283 may extend along the second direction (the Y axis direction of FIG. 6). Each touch trace 214 is electrically insulated from the second scanning lines 283. In order to reduce adverse effects of the third conductive layer 209 on the display, each touch trace 214 overlaps with one data line 29. That is, a projection of each touch trace 214 on the substrate 201 overlaps with a projection of one data line 29 on the substrate 201.

In the present exemplary embodiment, the plurality of first touch sensing electrodes 2121 also functions as the common electrodes of the display panel 200. When the touch sensing electrodes are functioning as common electrode, the touch sensing electrodes 2121 cooperate with the pixel electrodes 2131 to rotate liquid crystal molecules (not shown). Specifically, the touch sensing electrodes 2121 and the pixel electrodes 2131 cooperatively generate electric fields to rotate the liquid crystal molecules (not shown) of the liquid crystal layer.

Figure 8:
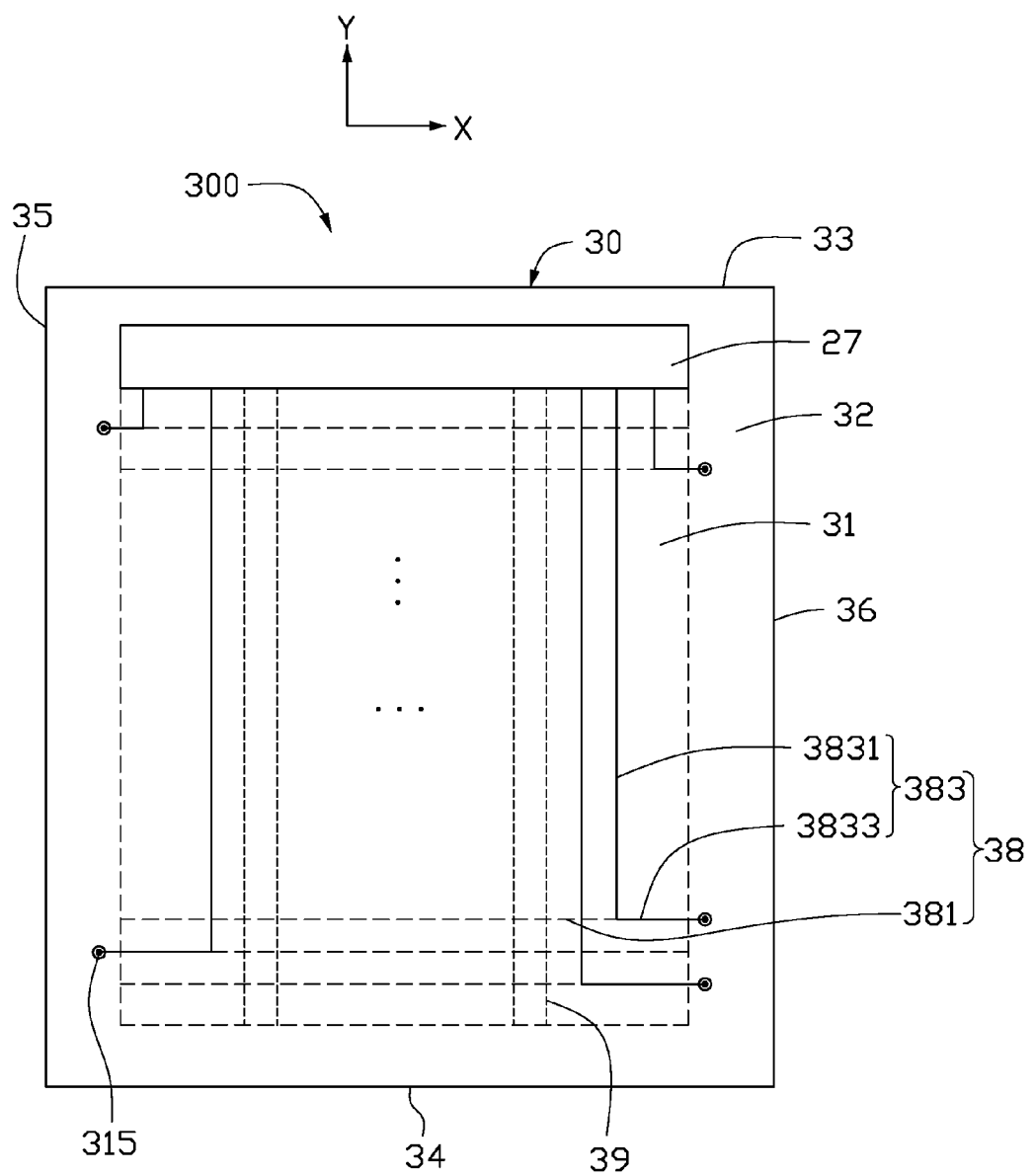
FIG. 8 is a planar view of a third exemplary embodiment of a display panel.
Figure 9:
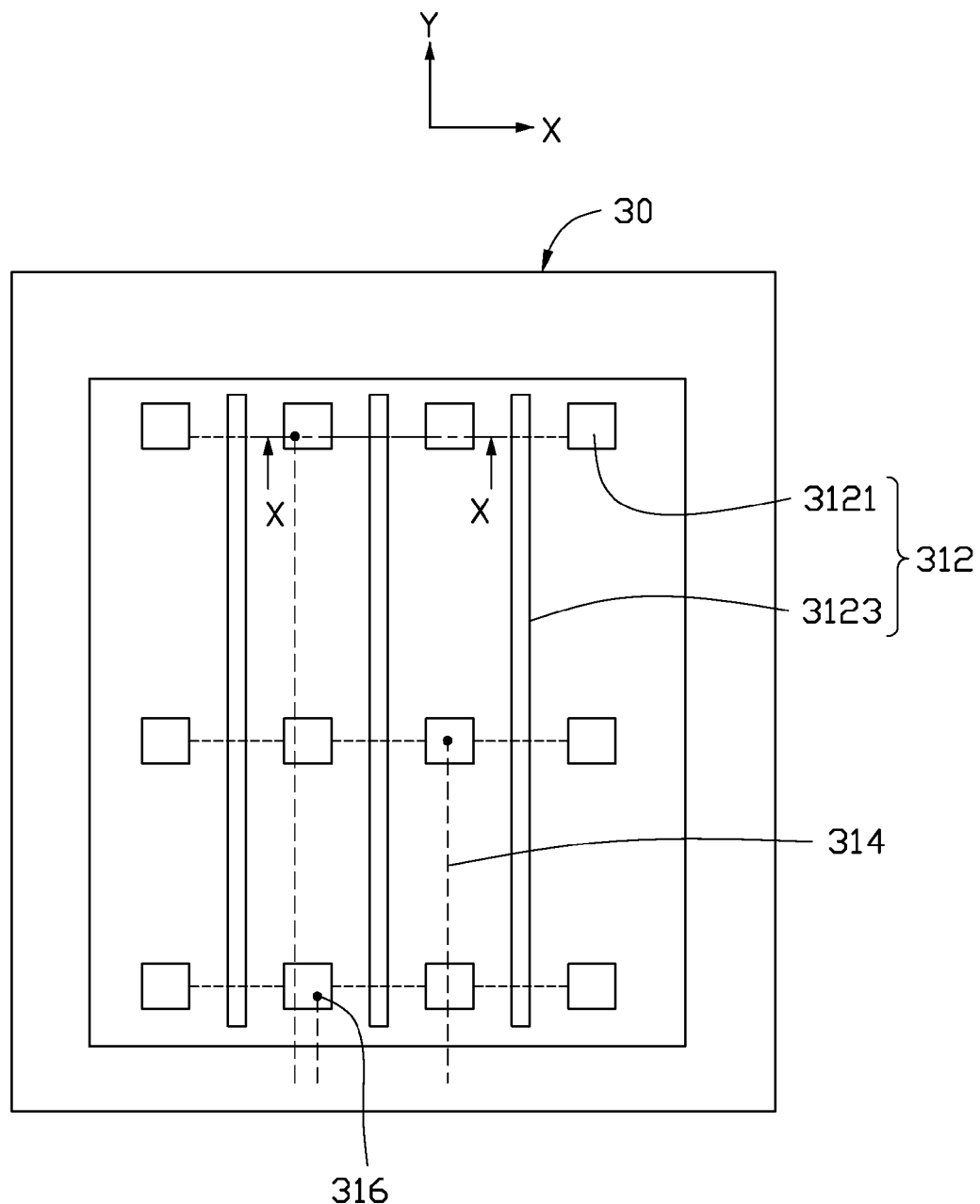
FIG. 9 is a planar view of a TFT substrate of the display panel of FIG. 8.
Figure 10:
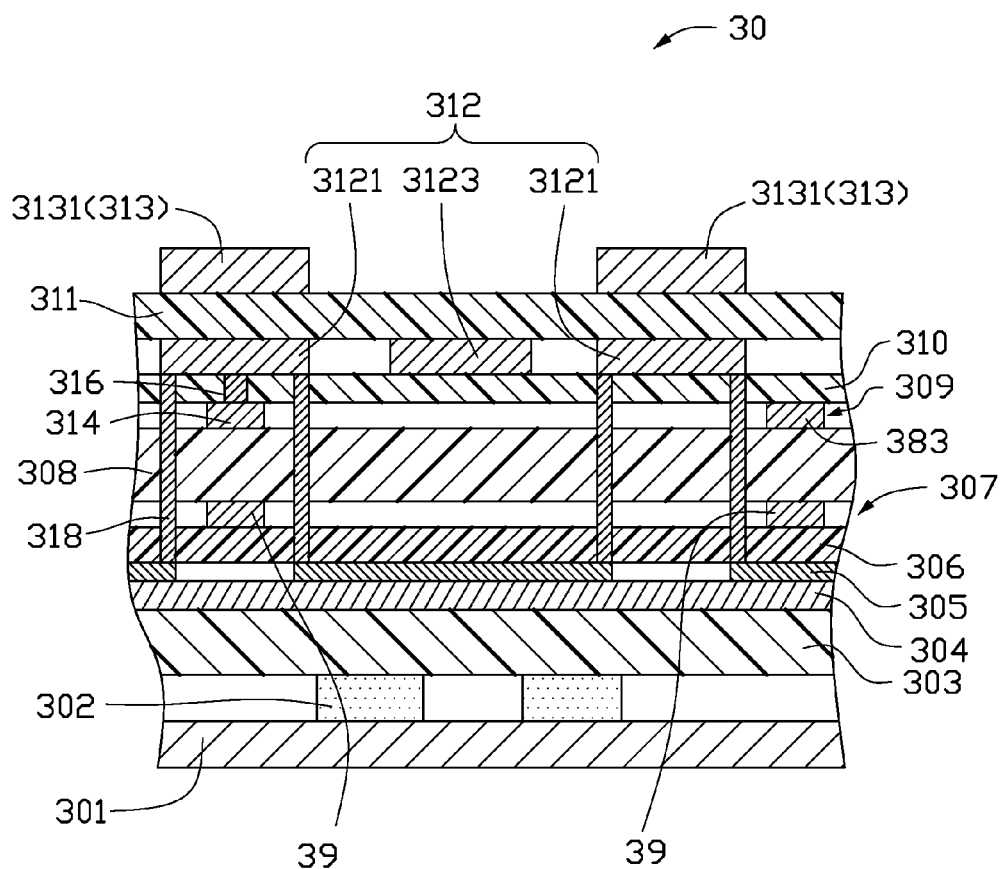
FIG. 10 is a cross-sectional view of the TFT substrate of FIG. 9 along the line X-X.

FIG. 8 through FIG. 10 illustrate a display panel 300 according to a third exemplary embodiment. As shown in FIG. 8, the display panel 300 includes a TFT substrate 30. The TFT substrate 30 defines a display area 31 and a non-display area 32 surrounding the display area 31. The TFT substrate 30 has four sides, an upper side 33, a lower side 34, a left side 35, and a right side 36. When the display panel 300 is being used, the upper side 33 and the lower side 34 are generally horizontal, and the left side 35 and the right side 36 are generally vertical.

For the TFT substrate 30, a portion of the non-display area 32 between the display area 31 and the upper side 33 is defined as an upper border region. A portion of the non-display area 32 between the display area 31 and the lower side 34 is defined as a lower border region. A portion of the non-display area 32 between the display area 31 and the left side 35 is defined as a left border region, and a portion of the non-display area 32 between the display area 31 and the right side 36 is defined as a right border region.

The display panel 300 further includes a gate driver 37 either in the upper border region or in the lower border region. In the present exemplary embodiment, the gate driver 37 is in the upper border region. The gate driver 37 does not occupy either the left border region or the right border region of the TFT substrate 30, thereby facilitating the narrowing of the left and right borders of the display panel 300.

As shown in FIG. 8, the TFT substrate 30 includes a plurality of scanning lines 38 and a plurality of data lines 39 in the display area 31. Each of the scanning lines 38 includes a first scanning line 381 and a second scanning line 383 coupled to the first scanning line 381. The first scanning lines 381 intersect the data lines 39. Each scanning line 38, especially the second scanning line 383 of each scanning line 38, is electrically coupled to the gate driver 37; and the first scanning line 381 of each scanning line 38 is electrically coupled to the gate electrodes of TFTs (not shown). That is, the gate driver 37 is electrically coupled to the gate electrodes (not shown) by the scanning line 38 and driving signals from the gate driver 37 can be transmitted to the gate electrodes of the TFTs.

As shown in FIG. 9, the TFT substrate 30 includes a touch sensing layer 312. The touch sensing layer 312 includes a plurality of first touch sensing electrodes 3121 and a plurality of second touch sensing electrodes 3123 in the display area 31. The first touch sensing electrodes 3121 are spaced apart from each other and arranged in an array. The first touch sensing electrodes 3121 are arranged in rows, each row of the first touch sensing electrodes 3121 extends along a first direction (the X axis direction in FIG. 9). Rows of the first touch sensing electrodes 3121 are arranged spaced apart from each other along a second direction (the Y axis direction in FIG. 9). Each second touch sensing electrode 3123 extends as a strip along the second direction and crosses with all the rows of the first touch sensing electrodes 3121. Each second touch sensing electrode 3123 is positioned between two adjacent first touch sensing electrodes 3121.

The first touch sensing electrodes 3121 in each row are electrically coupled together. One first touch sensing electrodes 3121 in each row is electrically coupled to a driver IC (not shown) by a touch trace 314.

FIG. 10 is a cross-sectional view of the TFT substrate of FIG. 9 taken along line X-X. As shown in FIG. 10, the TFT substrate 30 includes a substrate 301, a light shielding layer 302 stacked on the substrate 301, a buffer layer 303 stacked on the light shielding layer 302, a first insulating layer 304 stacked on the buffer layer 303, and a first conductive layer 305 stacked on the first insulating layer 304. A second insulating layer 306 is stacked on the first conductive layer 305, a second conductive layer 307 is stacked on the second insulating layer 306, a planar layer 308 is stacked on the second conductive layer 307, a third conductive layer 309 is stacked on the planar layer 308, and a first passivation layer 310 is stacked on the third conductive layer 309. A touch sensing layer 312 is stacked on the first passivation layer 310. FIG. 10 also shows that the TFT substrate 30 includes a second passivation layer 311 and a pixel electrode layer 313 that are not shown in FIG. 9. The second passivation layer 311 is stacked on the touch sensing layer 312, and the pixel electrode layer 313 is stacked on the second passivation layer 311. It is understood that light shielding layer 302 and the buffer layer 303 may be omitted.

The first conductive layer 305 may form the gate electrodes (not shown) of the TFTs and the first scanning line 381 electrically coupled to the gate electrodes. The second conductive layer 307 may form the source electrodes (not shown) of the TFTs, the drain electrodes (not shown) of the TFTs, and the data lines 39 electrically coupled to the source electrodes. The third conductive layer 309 may form the second scanning lines 383 and the touch traces 314.

The channel layers of TFTs are not shown in FIG. 10. These may be formed on the second insulating layer 306. The light shielding layer 302 overlaps with the channel layer, thus light from a backlight module (not shown) of the display panel 300 cannot be irradiated to the channel layer.

As shown in FIG. 10, the second scanning lines 283 are stacked on the first scanning lines 381, and an insulating material layer is provided between the first scanning lines 381 and the second scanning lines 383. In the present exemplary embodiment, the insulating material layer includes the second insulating layer 306 and the planar layer 308 stacked on the second insulating layer 306.

One end of each first scanning line 381 is electrically coupled to one second scanning line 383, as shown in FIG. 8, and each first scanning line 381 is also electrically coupled to the gate electrodes (not shown). One end of each second scanning line 383 is electrically coupled to one first scanning line 381, and the other end of each second scanning line 383 is electrically coupled to the gate driver 37. As shown in FIG. 8, both the first scanning lines 381 and the second scanning lines 383 are mainly in the display area 31, each first scanning line 381 is electrically coupled to one second scanning line 383 in the non-display area 31. The gate driver 37 does not occupy either the left border region or the right border region of the TFT substrate 30, thereby facilitating the narrowing of the left and right borders of the display panel 300.

Specifically, in the present exemplary embodiment, and as shown in FIG. 8, one first scanning line 381 and its corresponding second scanning line 383 are electrically connected in the non-display area 32 by a first via hole 315. The first via hole 315 extends through both the second insulating layer 306 (shown in FIG. 10) and the planar layer 308 (shown in FIG. 10).

As shown in FIG. 8, each first scanning line 381 extends along a first direction (the X axis direction of FIG. 8), and each data line 39 extends along a second direction (the Y axis direction of FIG. 8) that is different from the first direction. Each second scanning line 383 includes a first line portion 3831 and a second line portion 3833 electrically coupled to the first line portion 3831. The first line portion 3831 of each second scanning line 383 extends along the second direction, the second line portion 3833 of each second scanning line 383 extends along the first direction. In the present exemplary embodiment, the first direction is perpendicular to the second direction. Both the second line portion 3833 of each second scanning line 383 and one corresponding first scanning line 381 extend to be in the non-display area 32 and are electrically coupled together in the non-display area 32. In order to reduce the aperture ratio of the display panel 300, the second line portion 3833 of each second scanning line 383 overlaps with one first scanning line 381. That is, a projection of the second line portion 3833 of each second scanning line 383 on the substrate 301 overlaps with a projection of the corresponding first scanning line 381 on the substrate 301.

As shown in FIG. 10, the touch sensing layer 312 forms a plurality of first touch sensing electrodes 3121 and a plurality of second touch sensing electrodes 3123. Each first touch sensing electrode 3121 is electrically coupled to at least one conductive line 318, and each conductive line 318 extends through the first passivation layer 310, the planar layer 308, and the second insulating layer 306. Two conductive lines 318 of every two adjacent first touch sensing electrodes 3121 are electrically coupled together above the first insulating layer 304, thus the first touch sensing electrodes 3121 in each row are electrically coupled together. One first touch sensing electrode 3121 in each row is electrically coupled to one touch trace 314 by a second via hole 316. The second via hole 316 extends through the first passivation layer 310. The pixel electrode layer 313 forms a plurality of pixel electrodes 3131. The touch sensing layer 312 and the pixel electrode layer 313 may be made of a transparent conductive material, such as indium tin oxide (ITO).

As shown in FIG. 10, the touch traces 314 and the second scanning lines 383 are located in a same layer (i.e. third conductive layer 309). Each touch trace 314 may extend along the second direction, thus each touch trace 314 may be parallel to the first line portion 3831 of each second scanning line 383. Each touch trace 314 is electrically insulated from the second scanning lines 383. In order to ensure non-connection of each touch trace 314 with the second line portion 3833 of any second scanning line 383, the second scanning lines 383 are located at a side of all of the touch traces 314. Alternatively, the second scanning lines 383 are located at opposite sides of all of the touch traces 314.

In the present exemplary embodiment, the plurality of first touch sensing electrodes 3121 also functions as common electrodes of the display panel 300. When the touch sensing electrodes function as the common electrode, the touch sensing electrodes 3121 cooperate with the pixel electrodes 3131 to rotate liquid crystal molecules (not shown). Specifically, the touch sensing electrodes 3121 and the pixel electrodes 3131 cooperatively generate electric fields to rotate the liquid crystal molecules (not shown) of the liquid crystal layer.

Figure 11:
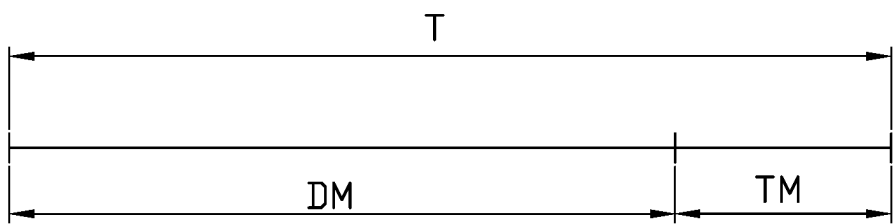
FIG. 11 is a diagrammatic view of driving time sequence of a display panel.

FIG. 11 shows a driving time sequences of the display panels 100, 200, 300. The display panel is driven by a time division driving method.

As shown in FIG. 11, one frame of sensing time, or a single sensing frame, is divided into a display period (DM) and a touch sensing period (TM). The driving circuit of the touch display device alternately drives the display panel to display during the DM and to detect touches during the TM, in one frame time.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A thin film transistor (TFT) substrate, the TFT substrate defining a display area and a non-display area surrounding the display area, the TFT substrate comprising:
   a substrate;
   a plurality of first scanning lines on the substrate and in the display area, each of the plurality of first scanning lines extending along a first direction;
   a plurality of data lines on the substrate and in the display area, each of the plurality of data lines extending along a second direction that is different from the first direction, each of the plurality of data lines electrically insulated from the plurality of first scanning lines;
   a conductive layer on the substrate and above the plurality of first scanning lines;
   at least one electrically insulating layer on the substrate and between the plurality of first scanning lines and the conductive layer;
   a touch sensing layer on the substrate and above the conductive layer;

wherein the conductive layer forms a plurality of second scanning lines in the display area and a plurality of touch traces; each of the plurality of touch traces is electrically coupled to the touch sensing layer; each of the plurality of second scanning lines is electrically coupled to one of the plurality of first scanning lines by extending through the at least one electrically insulating layer.

2. The TFT substrate of claim 1, wherein each of the plurality of second scanning lines extends along the second direction; each of the plurality of second scanning lines and the one of the plurality of first scanning lines is electrically coupled together in the display area by a via hole extending through the at least one electrically insulating layer.

3. The TFT substrate of claim 2, wherein a layer of the plurality of data lines is between a layer of the plurality of first scanning lines and the conductive layer; a projection of each of the plurality of second scanning lines on the substrate does no overlap with a projection of any of the plurality of data lines on the substrate.

4. The TFT substrate of claim 1, wherein each of the plurality of second scanning lines comprises a first line portion and a second line portion electrically coupled to the first line portion; the first line portion extends along the second direction; the second line portion extends along the first direction; the second line portion of each of the plurality of second scanning lines and the one of the plurality of first scanning lines extend to be in the non-display area and are electrically coupled together in the non-display area.

5. The TFT substrate of claim 4, wherein a projection of the second line portion of each of the plurality of second scanning lines on the substrate overlaps with a projection of the one of the plurality of first scanning lines on the substrate.

6. The TFT substrate of claim 4, wherein the plurality of touch traces is in the display area; and the plurality of second scanning lines is located by at least one side of all of the plurality of touch traces.

7. The TFT substrate of claim 1, wherein each of the plurality of touch traces extends along the second direction.

8. The TFT substrate of claim 7, wherein a projection of each of the plurality of touch traces on the substrate overlaps with a projection of the one of the plurality of data lines on the substrate.

9. The TFT substrate of claim 1, wherein the touch sensing comprises a plurality of touch sensing electrodes in an array; a passivation layer is between the touch sensing layer and the conductive layer; each of the plurality of touch sensing electrodes is electrically coupled to one of the plurality of touch traces by a via hole extending through the passivation layer.

10. The TFT substrate of claim 1, wherein the touch sensing layer comprises a plurality of first touch sensing electrodes and a plurality of second touch sensing electrodes; the plurality of first touch sensing electrodes is arranged in an array of rows and columns; each row of the first touch sensing electrodes extends along the first direction; each of the plurality of second touch sensing electrodes extends as a strip along the second direction and cross with all of the rows of the first touch sensing electrodes; each of the plurality of second touch sensing electrodes is positioned between two adjacent first touch sensing electrodes.

11. The TFT substrate of claim 10, wherein the first touch sensing electrodes in each row of the first touch sensing electrodes are electrically coupled together; one of the first touch sensing electrodes in each row of the first touch sensing electrodes is electrically coupled to one of the plurality of touch traces.

12. The TFT substrate of claim 11, wherein each of the plurality of first touch sensing electrodes is electrically coupled to at least one conductive line, each conductive line extends through electrically insulating layers between the touch sensing layer and a layer of the plurality of first scanning lines; two conductive lines of every two adjacent first touch sensing electrodes are electrically coupled together.

13. A display panel comprising:
a thin film transistor (TFT) substrate, the TFT substrate defining a display area and a non-display area surrounding the display area, the TFT substrate comprising:
a substrate;
a plurality of first scanning lines on the substrate and in the display area, each of the plurality of first scanning lines extending along a first direction;
a plurality of data lines on the substrate and in the display area, each of the plurality of data lines extending along a second direction that is different from the first direction, each of the plurality of data lines electrically insulating from the plurality of first scanning lines;
a conductive layer on the substrate and above the plurality of first scanning lines;
at least one electrically insulating layer on the substrate and between the plurality of first scanning lines and the conductive layer;
a touch sensing layer on the substrate and above the conductive layer;
wherein the conductive layer forms a plurality of second scanning lines in the display area and a plurality of touch traces; each of the plurality of touch traces is electrically coupled to the touch sensing layer; each of the plurality of second scanning lines is electrically coupled to one of the plurality of first scanning lines by extending through the at least one electrically insulating layer.

14. The display panel of claim 13, wherein each of the plurality of second scanning lines extends along the second direction; each of the plurality of second scanning lines and the one of the plurality of first scanning lines is electrically coupled together in the display area by a via hole extending through the at least one electrically insulating layer.

15. The display panel of claim 14, wherein a layer of the plurality of data lines is between a layer of the plurality of first scanning lines and the conductive layer; a projection of each of the plurality of second scanning lines on the substrate does no overlap with a projection of any of the plurality of data lines on the substrate.

16. The display panel of claim 13, wherein each of the plurality of second scanning lines comprises a first line portion and a second line portion electrically coupled to the first line portion; the first line portion extends along the second direction; the second line portion extends along the first direction; the second line portion of each of the plurality of second scanning lines and the one of the plurality of first scanning lines extend to be in the non-display area and are electrically coupled together in the non-display area.

17. The display panel of claim 16, wherein a projection of the second line portion of each of the plurality of second scanning lines on the substrate overlaps with a projection of the one of the plurality of first scanning lines on the substrate.

18. The display panel of claim 13, wherein each of the plurality of touch traces extends along the second direction; a projection of each of the plurality of touch traces on the substrate overlaps with a projection of the one of the plurality of data lines on the substrate.

19. The display panel of claim 13, wherein the touch sensing comprises a plurality of touch sensing electrodes in an array; a passivation layer is between the touch sensing layer and the conductive layer; each of the plurality of touch sensing electrodes is electrically coupled to one of the plurality of touch traces by a via hole extending through the passivation layer.

20. The display panel of claim 13, wherein the touch sensing layer comprises a plurality of first touch sensing electrodes and a plurality of second touch sensing electrodes; the plurality of first touch sensing electrodes is arranged in an array of rows and columns; each row of the first touch sensing electrodes extends along the first direction; each of the plurality of second touch sensing electrodes extends as a strip along the second direction and cross with all of the rows of the first touch sensing electrodes; each of the plurality of second touch sensing electrodes is positioned between two adjacent first touch sensing electrodes; the first touch sensing electrodes in each row of the first touch sensing electrodes are electrically coupled together; one of the first touch sensing electrodes in each row of the first touch sensing electrodes is electrically coupled to one of the plurality of touch traces.

* * * * *